(12) United States Patent
Kimura

(10) Patent No.: US 7,592,103 B2
(45) Date of Patent: Sep. 22, 2009

(54) ELECTRON BEAM WRITING METHOD AND LITHOGRAPHY MASK MANUFACTURING METHOD

(75) Inventor: Yasuki Kimura, Tokyo (JP)

(73) Assignee: Hoya Corporation, Tokyo (JP)

( * ) Notice: Subject to any disclaimer, the term of this patent is extended or adjusted under 35 U.S.C. 154(b) by 716 days.

(21) Appl. No.: 11/094,306

(22) Filed: Mar. 31, 2005

(65) Prior Publication Data

US 2005/0221204 A1 Oct. 6, 2005

(30) Foreign Application Priority Data

Mar. 31, 2004 (JP) .......................... P2004-104083

(51) Int. Cl.
*G03F 9/00* (2006.01)
(52) U.S. Cl. .............................. 430/5; 430/30; 430/296; 430/942
(58) Field of Classification Search ..................... 430/5, 430/30, 296, 942
See application file for complete search history.

(56) References Cited

FOREIGN PATENT DOCUMENTS

| | | |
|---|---|---|
| JP | 2003-107665 A | 4/2003 |
| JP | 2003-332203 A | 11/2003 |

OTHER PUBLICATIONS

"Photomask and X-Ray Mask Technology VI", SPIE—The International Society for Optical Engineering, vol. 3748, Apr. 13-14, 1999, 5 pages.
Tadashi Komagata, et al., "Development of a E-Beam Lithography System for 100-90nm Node Reticles", Proceedings of SPIE, vol. 5130, 2003, pp. 328-339.

*Primary Examiner*—Christopher G Young
(74) *Attorney, Agent, or Firm*—Sughrue Mion, PLLC

(57) ABSTRACT

A writing pattern to be a correcting object is divided by a rough mesh for a Foggy effect correction and a fine mesh for a proximity effect correction, a rate of an area occupied by the pattern to be written for each of the meshes is obtained, a stored energy based on a Foggy effect and a proximity effect in execution of exposure in a state in which a correction for a calculating object mesh is not carried out at all is calculated, an dose in the fine mesh for a proximity effect correction is obtained by a first calculation in such a manner that an influence of the Foggy effect and the proximity effect is reduced and a pattern and a dimension which can disregard the influence of the Foggy effect and the proximity effect are coincident with each other by the stored energy which is calculated, are calculation is carried out in such a manner that the pattern and the dimension which can disregard the influence of the Foggy effect and the proximity effect are coincident with each other with the influence of the Foggy effect and the proximity effect fixed, and the recalculation is repeated until desirable precision in a dimension is reached.

9 Claims, 4 Drawing Sheets

(BEFORE CORRECTION)  (AFTER CORRECTION)  (ISOLATION)

ORIGINAL DATA

SIZING MAP

CELL SIZE (0.5-1.0μm)

CORRECTING CALCULATION REGION

ELECTRON BEAM WRITING METHOD AND LITHOGRAPHY MASK MANUFACTURING METHOD

This application claims foreign priority based on Japanese Patent application No. 2004-104083, filed Mar. 31, 2004, the contents of which is incorporated herein by reference in its entirety.

BACKGROUND OF THE INVENTION

1. Field of the Invention

The present invention relates to an electron beam writing method to be used in processes for manufacturing a semiconductor device and a liquid crystal display or a process for manufacturing a lithography mask to be utilized in the processes, and to a control for the dimension of a pattern to be written by an electron beam. 2. Description of the Related Art For example, in a process for manufacturing a photomask, there has conventionally been used an electron beam writing method for writing a predetermined pattern by an electron beam for a resist film formed on a photomask blank.

In the electron beam writing method, a control for the dimension of a pattern to be written has a problem in that a dimensional error made by a proximity effect and a Foggy effect is to be compensated as described in Japanese OPI Patent JP2003-332203 and Japanese OPI Patent JP2003-107665.

The proximity effect represents a phenomenon in which a dimensional error is made by exposing a resist to a light with an electron beam (a backward scattering electron) transmitted through a resist film and reflected (scattered) from the surface of a substrate, and an influence range in the use of an electron beam of 50 kV is approximately 15 μm, for example.

The Foggy effect represents a phenomenon in which an electron scattered from the surface of a resist film or the surface of a substrate is reflected by a column or a chamber in a writing device and reaches the resist film again to expose the resist to a light, and has an influence within a range of approximately 30 mm depending on the structure of the writing device.

Referring to these two phenomena, the proximity effect represents a fog caused by the backward scattering of an electron beam transmitted through a resist film and the Foggy effect represents a fog caused by scattering through the column of a reflected electron on the surface of the resist film. Although both of them have an extreme difference in causes and scattering radii, they are fog phenomena. In both of them, the total energies of the electron beams generating the fogs are almost equal to each other.

Under the historical circumstances that the Foggy effect was found after the passage of a long time since the establishment of a proximity effect theory, however, the Foggy effect has been treated as a separate phenomenon from the proximity effect and the dimensional error of a writing pattern has also been corrected individually for each effect.

Conventionally, the dimensional error of a writing pattern which is made by the proximity effect has been corrected in the following manner.

A proximity effect correction (PEC) used in a general writing device utilizing an electron beam of 50 kV serves to compensate the influence of backward scattering by regulating a dose (an amount of exposure), thereby correcting a dimensional error as shown in FIG. 5. In a recent writing device, the amount of exposure is calculated by using a recalculating technique. In the recalculating technique, the same technique as a correcting method in a former generation writing device is used for a first calculation and a different equation is used in a second recalculation and thereafter. The newest writing device serves to carry out these calculations while performing exposure. For this reason, various techniques for simplifying the calculations have been employed in order to easily carry out a processing by means of a calculator.

However, the first calculation in the recalculating technique includes a special assumption that "a pattern density is constant for a calculating object and a periphery thereof". Although the equation for correcting the proximity effect is very simple, that is, can be described in only an arithmetical operation, the first calculation includes the special assumption and has a leap in logic. For this reason, an excellent correction cannot be carried out.

[First Calculation]

The first calculation in the recalculating technique, that is, the correcting method in the former generation writing device is carried out in the following manner.

First of all, the degree of backward scattering is estimated. For example, the estimation of the backward scattering for a writing pattern $E0$ on a center in FIG. 5 is carried out by dividing the influence region of the backward scattering into cells having a predetermined size (0.5 μm square (in all directions) to 1.0 μm square (in all directions)). More specifically, the area of a writing pattern occupying the cell is obtained every cell. Assuming that the writing pattern occupying each cell is present on the center of the cell, the degree of the influence of the backward scattering from each cell to a cell on which the writing pattern $E0$ is written is weighted and multiplied to obtain a stored energy ratio Ebp for the backward scattering. In the case in which all of the cells are written including the cell in which the writing pattern $E0$ is written, Ebp is equal to 1. In this stage, the result of the proximity effect correction has not been calculated yet. For this reason, it is assumed that all the writing operations are carried out in the same dose. Ebp in the first calculation is represented as $Ebp0$.

FIG. 6 shows an energy profile in electron beam writing. Herein, a unit system is formed in such a manner that an amount of exposure generates a forward scattering energy. Moreover, a forward scattering energy profile is set to be a trapezoid in order to simplify a calculation, and backward scattering is represented as a perfectly flat offset. A width $X0$ of the inclined portion of the trapezoid representing the forward scattering is a parameter representing a resolution reflecting a beam profile, the forward scattering and the performance of a resist. The intersecting point of the inclined portion of the trapezoid and a developing threshold Eth indicates the position of the edge of a pattern to be written.

Referring to any writing pattern to which a dimension is to be adapted, next, description will be given to a method of adapting a dimension to an isolated pattern in the case in which the backward scattering is not present. In this case, the position of the edge of the writing pattern is represented as $Xa$ and the amount of exposure at this time is represented as a reference dose Da.

The backward scattering is present so that the edge of the writing pattern is shifted to $Xb$ (a state set before a correction). If the amount of exposure is changed from the reference dose Da to a correction dose $Ds0$, the position of the edge of the writing pattern is corrected to $Xa$ (a state set after the correction).

The corrected dose $Ds0$ in a first calculation is expressed in the following [Equation 1] from the model, wherein the ratio of an energy absorbed by the forward scattering to an energy absorbed by the backward scattering is represented as ηe.

$$Ds0=Da/\{1+(Da/Eth)\eta e\ Ebp\} \quad \text{(Equation 1)}$$

In an actual writing device, it is assumed that the following [Equation 2] is established by the principle in which the diameter of an electron beam is coincident with the dimension of a writing pattern.

$$Da/Eth=2 \quad \text{(Equation 2)}$$

Consequently, Ds0 is expressed in the following [Equation 3].

$$Ds0=Da/(1+2\eta ep\ Ebp) \quad \text{(Equation 3)}$$

Herein, the [Equation 2] is not always established in an actual process. For this reason, ηep in the [Equation 3] indicates a simple device control parameter.

As described above, the correction includes an assumption that "a pattern density is constant for a calculating object and a periphery thereof". Although the backward scattering is represented as [Da·η·Ebp] before the correction, it is changed to [Ds·η·Ebp] after the correction. It is assumed that all of writing patterns E1, E2 and E3 in FIG. 5 are written by the same dose Ds.

Depending on the correcting method, an accurate correction is carried out for an L/S pattern in a wide area in which a pattern density is constant for a calculating object and a periphery thereof. In the case in which the pattern density is not constant for the calculating object and the periphery thereof, however, the accurate correction is not carried out. It is apparent that the correcting method is the product of a compromise to obtain a result which is moderately close to a correct answer by a minimum calculation in the days in which the resources of a calculator are insufficient.

[Recalculation]

Also in a recalculation, a stored energy ratio Ebp for the backward scattering is calculated. First of all, description will be given to a first recalculation. The recalculation does not use an assumption that all of a calculating object and a periphery thereof are written in the same amount of exposure. The stored energy ratio Ebp (Ebp1) of the backward scattering to be used in the first recalculation is calculated by using the amount of exposure to be the result of the first calculation.

In the recalculation, the amount of exposure on the periphery of the calculating object is not coincident with the amount of exposure of the calculating object as shown in FIG. 7. For this reason, a backward scattering offset is fixed and only the amount of exposure of the calculating object is regulated to carry out a correction.

A correcting equation guided from such a model is expressed in the following [Equation 4].

$$Ds1=Da\{1-(Da/Eth)\eta e\ Ebp1\} \quad \text{(Equation 4)}$$

For the same reason as the first calculation, the following [Equation 5] is used in an actual writing device.

$$Ds1=Da(1-2\eta ep\cdot Ebp1) \quad \text{(Equation 5)}$$

As a matter of course, when the amount of exposure is changed by the recalculation, actual backward scattering is also influenced. Referring to the influence, the recalculation is carried out plural times to converge on a correct value. More specifically, it is said that the recalculating method is a kind of feedback circuit.

After a second recalculation, a stored energy ratio Ebp of the backward scattering is obtained to repeat the same technique by setting, as an initial value, a value obtained by a last recalculation.

In the first calculation and the recalculation, the calculating equations are different from each other. The reason is that the magnitude of the backward scattering is not changed in the recalculation, and therefore, there is brought an over correcting state in which Ds is extremely small in some cases.

In the recalculation, if an initial value is excessively different, a convergence is delayed. For example, the recalculation is to be carried out ten times or more in order to obtain, through the execution of all of the recalculating equations, precision in which the recalculation is carried out almost twice by setting the result of a first calculation to be an initial value. More, specifically, it can be said that the first calculation is not always carried out on the correct assumption but precision in the initial value in the recalculation (after a second calculation) is sufficient.

[Correction of Foggy Effect]

For the correction of a fog by the Foggy effect, basically, a calculating mesh is expanded to approximately 1 mm, thereby carrying out the first calculation.

An actual dose is described in the following [Equation 6] for a reference dose, that is, a dose in which a writing pattern having a predetermined dimension is to be formed in the case in which neither the proximity effect nor the Foggy effect is produced.

$$[\text{Actual dose}] = [\text{Reference dose}] \times [\text{Amount of dose modulation of proximity effect correction}] \times [\text{Amount of dose modulation of Foggy effect correction}] \quad \text{(Equation 6)}$$

In the manufacture of a lithography mask such as a photomask, first of all, a pattern is written as described above on a resist layer coated to form a shielding film pattern on a photomask blank having a shielding film on a transparent substrate. Subsequently, the resist layer is developed to form a resist pattern and the shielding film is etched by using the resist pattern to be a mask, and the remaining resist pattern is peeled so that the photomask is manufactured.

In the electron beam writing method described above, there is the following problem.

More specifically, in a conventional electron beam writing method, the result of the proximity effect correction influences the Foggy effect, and furthermore, the result of the Foggy effect correction influences the proximity effect correction. However, such influences are not considered at all.

In the conventional electron beam writing method, moreover, an error made by the in-plane uniformity of etching or development cannot be corrected, and furthermore, a local loading effect caused by the etching cannot be corrected.

Furthermore, the amount of the proximity effect correction fluctuates in a plane so that the density dependency of a pattern dimension is changed in "a method of correcting a line width based on only an dose" as described in claim 13 of the JP2003-107665, for example.

With an increase in the integration of a semiconductor device, particularly, a mask pattern with high precision in a dimension is required in a lithography mask in which a pattern tends to be fine and complicated.

SUMMARY OF THE INVENTION

In consideration of the actual circumstances, the invention is proposed and provides an electron beam writing method capable of correcting the dimension of a writing pattern with high precision which takes both a proximity effect and a Foggy effect into consideration and preventing a fluctuation in a dimensional characteristic due to the density of the writing pattern, and furthermore, enhancing an in-plane uniformity in a resist stage.

Moreover, the invention provides a method of manufacturing a lithography mask having a mask pattern with high precision in a dimension by manufacturing a lithography mask using the electron beam writing method.

In order to solve the problems, an electron beam writing method according to the invention has the following structures.

[Structure 1]

The invention provides an electron beam writing method for correcting a dimension of a pattern to be written by an electron beam, comprising the steps of dividing a writing pattern to be a correcting object by a rough mesh for a Foggy effect correction and a fine mesh for a proximity effect correction, obtaining a rate of an area occupied by the pattern to be written for each of the meshes, calculating a stored energy based on a Foggy effect and a proximity effect in execution of exposure in a state in which a correction is not carried out for a calculating object mesh at all, obtaining an dose in the fine mesh for a proximity effect correction by a first calculation in such a manner that an influence of the Foggy effect and the proximity effect is reduced and a pattern and a dimension which can disregard the influence of the Foggy effect and the proximity effect are coincident with each other by the stored energy which is calculated, carrying out a recalculation in such a manner that the pattern and the dimension which can disregard the influence of the Foggy effect and the proximity effect are coincident with each other with the influence of the Foggy effect and the proximity effect fixed, and repeating the recalculation until desirable precision in a dimension is reached, thereby correcting a dimensional error of the writing pattern by the proximity effect and the Foggy effect.

[Structure 2]

Moreover, the invention provides an electron beam writing method for correcting a dimension of a pattern to be written by an electron beam, comprising the steps of dividing a writing pattern to be a correcting object by a rough mesh for a Foggy effect correction and a fine mesh for a proximity effect correction, obtaining a rate of an area occupied by the pattern to be written for each of the meshes, calculating a stored energy based on a Foggy effect and a proximity effect in execution of exposure in a state in which a correction is not carried out for a calculating object mesh at all, obtaining an dose in the fine mesh for a proximity effect correction by a first calculation in such a manner that an influence of the Foggy effect and the proximity effect is reduced and a pattern and a dimension which can disregard the influence of the Foggy effect and the proximity effect are coincident with each other by the stored energy which is calculated, carrying out a recalculation using, as a result of a correction, a value obtained by acquiring an dose through a calculation, obtaining a difference from an dose in a last calculation, multiplying the difference by a certain value which is equal to or greater than 0 and is smaller than 1, and adding the value thus obtained to the dose in the last calculation in such a manner that the pattern and the dimension which can disregard the influence of the Foggy effect and the proximity effect are coincident with each other, and repeating the recalculation until desirable precision in a dimension is reached, thereby correcting a dimensional error of the writing pattern by the proximity effect and the Foggy effect.

[Structure 3]

The invention provides the electron beam writing method according to the structure 1 or 2, wherein a developing threshold is specified every rough mesh for a Foggy effect correction to correct an in-plane uniformity of development while maintaining a density depending characteristic of a writing pattern to be constant in a plane.

[Structure 4]

The invention provides the electron beam writing method according to the structure 1 or 2, wherein a developing threshold and an etching critical dimension loss are specified every rough mesh for a Foggy effect correction to correct an in-plane uniformity of development and to enhance the in-plane uniformity after etching while maintaining a density depending characteristic of a writing pattern to be constant in a plane.

[Structure 5]

The invention provides the electron beam writing method according to the structure 1 or 2, wherein a developing threshold is specified every rough mesh for a Foggy effect correction and data subjected to sizing for compensating an etching critical dimension loss are used to enhance an in-plane uniformity after etching while maintaining a density depending characteristic of a writing pattern to be constant in a plane.

[Structure 6]

The invention provides the electron beam writing method according to the structure 1 or 2, wherein the dose is obtained through the first calculation by multiplying a reference dose on which a writing pattern having a desirable dimension is formed when there is neither the proximity effect nor the Foggy effect by a fluctuation amount of a proximity effect correction, and furthermore, a fluctuation amount of a Foggy effect correction.

[Structure 7]

Furthermore, the invention provides a method of manufacturing a lithography mask for manufacturing a lithography mask in which a mask pattern is formed on a substrate, comprising the step of writing a pattern on a resist layer for forming the mask pattern by using the electron beam writing method according to any of the structures 1 to 6.

In the electron beam writing method according to the invention, it is possible to correct the dimension of a writing pattern with high precision in consideration of both the proximity effect and the Foggy effect.

In the invention, moreover, it is possible to prevent a fluctuation in a dimensional characteristic based on the density of a pattern which is changed by only the in-plane correction of a sensitivity, thereby enhancing an in-plane uniformity in a resist stage. Furthermore, the invention can also enhance an in-plane uniformity in an etching stage.

More specifically, the invention can provide an electron beam writing method capable of correcting the dimension of a writing pattern with high precision in consideration of both the proximity effect and the Foggy effect and preventing a fluctuation in a dimensional characteristic due to the density of the writing pattern, and furthermore, enhancing an in-plane uniformity in a resist stage.

Furthermore, the invention can provide a method of manufacturing a lithography mask having a mask pattern with high precision in a dimension by manufacturing the lithography mask using the electron beam writing method.

DESCRIPTION OF THE PREFERRED EMBODIMENTS

Figure 1:
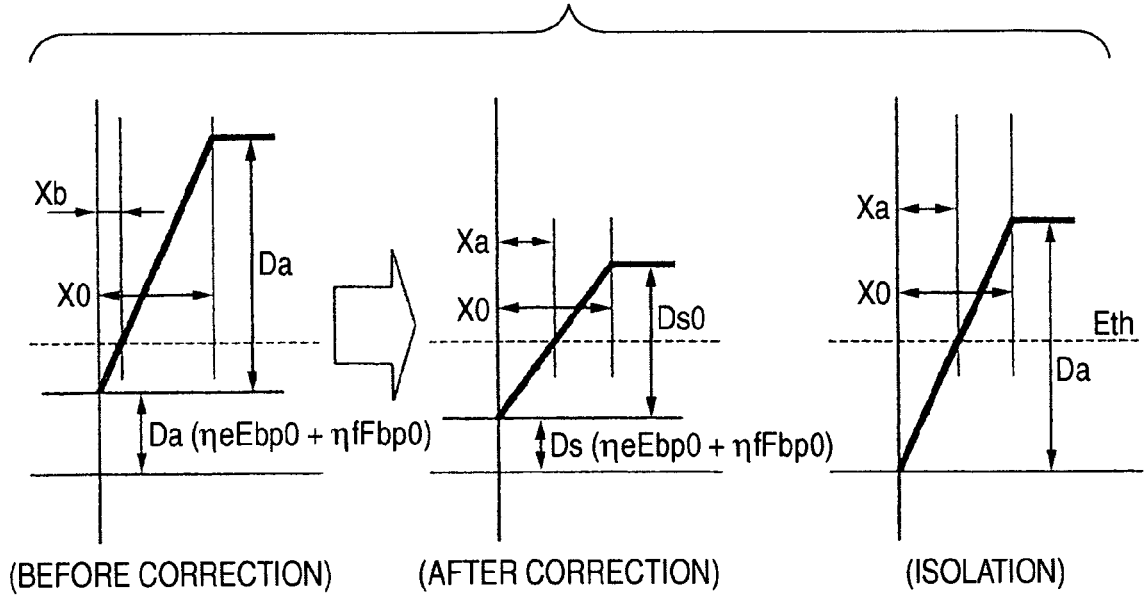
FIG. 1 is a conceptual diagram showing a first calculation according to a first embodiment of a method of writing an electron beam in accordance with the invention.

Embodiments of the present invention will be described hereinbelow by reference to the writings. Unless otherwise specifically defined in the specification, terms have their ordinary meaning as would be understood by those of ordinary skill in the art.

Embodiments of the invention will be described below with reference to the writings.

An electron beam writing method according to the invention serves to draw, by an electron beam, a predetermined pattern for a resist film formed on a substrate in a process for manufacturing a semiconductor device or a liquid crystal display, and serves to compensate a dimensional error made by a proximity effect and a Foggy effect, thereby controlling the dimension of a pattern to be written.

First Embodiment

As a first embodiment of the electron beam writing method according to the invention, description will be given to the basic portion of the correction of the dimension of a writing pattern which unifies a proximity effect correction (PEC) and a Foggy effect correction. This relates to a multiple calculating technique which takes both the proximity effect and the Foggy effect into consideration.

In the following embodiment, description will be given on the assumption that a device for carrying out writing by an electron beam of 50 kV is used as a writing device.

A writing pattern to be a correcting object is divided by a rough mesh for a Foggy effect correction (which will be hereinafter referred to as a Foggy mesh and is 1 mm square (in all directions) in the embodiment) and a fine mesh for a proximity effect correction (which will be hereinafter referred to as a proximity effect correcting mesh and is 0.5 μm square (in all directions) in the embodiment).

It is noted that the Foggy mesh might be preferably employed from the practical point of view because said rough mesh can make the calculation speed much higher than that of being performed in case of using the mesh for the proximity effect correction. However, it is also possible to form the foggy mesh in the same size as the mesh for the proximity effect correction.

The respective meshes are set to have such sizes as to be supposed to be sufficiently small for respective influence ranges (approximately 30 mm with the Foggy effect and approximately 15 μm with the proximity effect).

First of all, description will be given to a first calculating technique.

Rates SdF k, l and SdP m,n of areas occupied by patterns to be written are calculated for the Foggy mesh and the proximity effect correcting mesh.

More specifically, SdF k, l represents a writing area density in each of Foggy meshes k and l and SdP m,n represents a writing area density in each of proximity effect correcting meshes m and n.

Referring to Foggy and backward scattering, stored energies Fbp0 k, l and Ebp0 m, n based on the Foggy effect and the proximity effect in the execution of exposure in a state in which a correction for a calculating object mesh is not carried out at all are calculated by the following [Equation 7].

$$Fbp0\ k,l = \Sigma\Sigma(Da \cdot SdF\ k+i,l+j \cdot Fid\ i,j)/\Sigma\Sigma Da \cdot Fid\ i,j$$

$$Ebp0\ m,n = \Sigma\Sigma(Da \cdot SdP\ m+i,n+j \cdot Eid\ i,j)/\Sigma\Sigma Da \cdot Eid\ i,j \quad \text{(Equation 7)}$$

Herein, calculating ranges (ranges of i and j) are set in such a manner that the influence ranges of the Foggy and proximity effects are sufficiently included.

Moreover, Da represents an dose without a correction (a reference dose), Fbp0 k, l represents a stored energy density obtained by the Foggy effect for a first calculation, Ebp0 m,n represents a stored energy density obtained by the proximity effect for the first calculation, Fid i, j represents a distribution of a Foggy electron energy intensity given to a peripheral section (i, j) by an incident electron, and Eid i, j represents a distribution of a proximity effect electron energy intensity given to the peripheral section (i, j) by the incident electron.

The reference dose Da implies an dose in which a desirable dimension can be obtained in such a situation that Foggy and proximity effect corrections can be disregarded.

In case of overall painting, if the calculating range is wider than the effect range, the stored energies Fbp0 k,l and Ebp0 m,n are 1, respectively.

From the stored energies Fbp0 k,l and Ebp0 m,n which are obtained, an dose Ds m,n based on a first calculation in the proximity effect correcting meshes m and n is calculated by the following [Equation 8]. It is assumed that the proximity effect correcting meshes m and n are included in the Foggy meshes k and l.

$$Ds0\ m,n = Da/\{1+(Da/Eth)(\eta e\ Ebp0\ m,n + \eta f\ Fbp0\ k,l)\} \quad \text{(Equation 8)}$$

Herein, Ds0 m,n represents a corrected dose, Da represents a reference dose in the same manner as in the [Equation 7] and Eth represents a developing threshold. Moreover, ηe represents a backward scattering coefficient (an energy ratio of forward scattering to backward scattering) and ηf represents an energy ratio of the forward scattering to the Foggy effect.

FIG. 1 is a conceptual diagram showing a first calculation according to the first embodiment.

As shown in FIG. 1, an offset component obtained by adding a backward scattering component and a Foggy component is supposed in the first embodiment.

After the correction, a pattern and a dimension which can disregard the backward scattering and the Foggy component are set to be coincident with each other in a state in which a forward scattering component (a portion having a rise), the backward scattering component and the Foggy component are reduced at a constant ratio.

It is noted that this reducing correction might be preferably taken from the practical point of view because it makes the calculation speed much higher, however, there is no specific disadvantage without adopting it.

A recalculation (kth) is carried out by the following [Equation 9].

$Dsk\ m,n = Da\{1-(Da/Eth)(\eta e \cdot Ebpk\ m,n+\eta f \cdot Fbpk\ k,l)\}$ $Ebpk\ m,n = \Sigma\Sigma Dsk-1\ n+i,\ m+j \cdot Sd\ n+i,\ m+j \cdot Eid\ i,j / \Sigma\Sigma Da \cdot Eid\ i,j$ $Fbpk\ k,l = \Sigma\Sigma Ek-1\ n+i,\ m+j \cdot Fid\ i,j / \Sigma\Sigma Da \cdot Fid\ i,j$ (Equation 9)

Referring to Fpbk k, l, it is necessary to use a mean exposure density Ek−1 in a calculating mesh which is a result obtained by calculating a total dose in the calculating mesh from an dose obtained in a last calculation and subsequently dividing the total dose by the area of the calculating mesh.

The recalculation is repeated until desirable precision in a dimension is reached.

Figure 2:
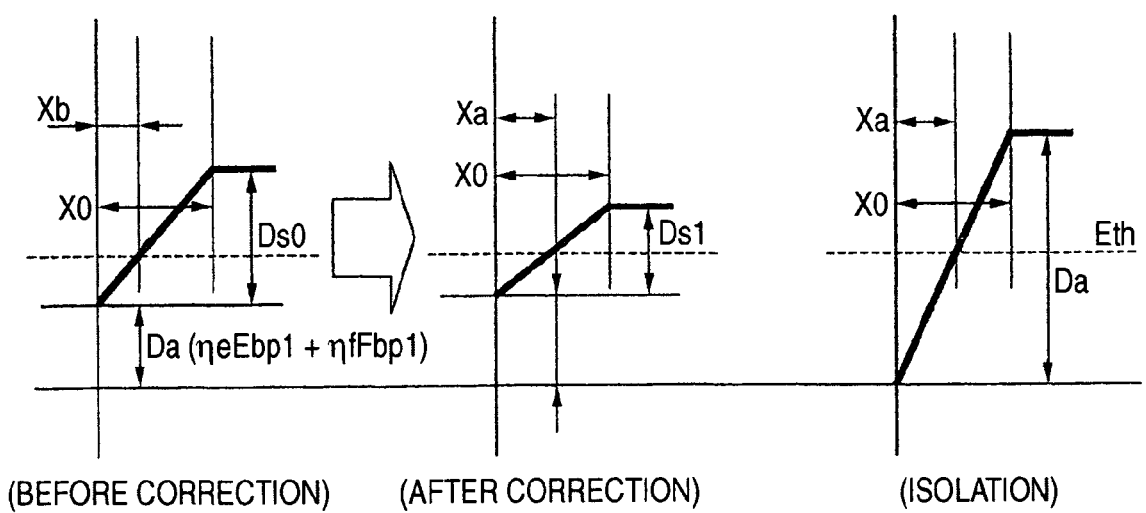
FIG. 2 is a conceptual diagram showing a recalculation according to the first embodiment of the electron beam writing method in accordance with the invention.

FIG. 2 is a conceptual diagram showing the recalculation according to the first embodiment.

As shown in FIG. 2, an offset component obtained by adding a backward scattering component and a Foggy component is supposed in the first embodiment.

In the first calculation, a pattern and a dimension which can disregard the backward scattering and the Foggy component are set to be coincident with each other in a state in which the forward scattering component (the portion having a rise), the backward scattering component and the Foggy component are reduced at a constant ratio.

In the recalculation, the pattern and the dimension which can disregard the backward scattering and the Foggy component are set to be coincident with each other by the regulation of an intensity (Ds) of the forward scattering component in a state in which the offset component obtained by adding the backward scattering component and the Foggy component is maintained to be fixed.

In the embodiment, it is possible to carry out a correction with high precision in consideration of both the Foggy effect and the proximity effect. As compared with a second embodiment which will be described below, the storage capacity of a storage unit required for a calculation may be small so that the resources of a calculator can be saved.

Second Embodiment

In a second embodiment, a processing to be carried out before a first calculation is the same as that in the first embodiment.

A first recalculation is carried out by using the following [Equation 10] and [Equation 11].

The calculating method according to the first embodiment will be referred to as a simple recalculating method and a calculating method according to the second embodiment will be referred to as a feedback recalculating method.

$Ds1\ m,n = Da\{1-(Da/Eth)(\eta e\ Ebp1\ m,n+\eta f\ Fbp1\ k,l)\}$ $DsF1\ m,n = Ds1-C(Ds0-Ds1)$ (Equation 10)

Herein, C represents a feedback coefficient which is usually set to be 0.7.

$Ebp1\ m,n = \Sigma\Sigma Ds0\ n+i,\ m+j \cdot Sd\ n+i,\ m+j \cdot Eid\ i,j / \Sigma\Sigma Da \cdot Eid\ i,j$ $Fbp1\ k,l = \Sigma\Sigma E0\ n+i,\ m+j \cdot Fid\ i,j / \Sigma\Sigma Da \cdot Fid\ i,j$ (Equation 11)

Referring to Fpb1 k,l, it is necessary to use a mean exposure density E0 k, l in a calculating mesh which is a result obtained by calculating a total dose in the calculating mesh from an dose obtained in a first calculation and subsequently dividing the total dose by the area of the calculating mesh.

After a second recalculation, a result obtained in a previous feedback recalculating method is used for calculating stored energy densities for a feedback method EbpFk m,n and FbpFk k,l as shown in the following [Equation 12].

$Dsk\ m,n = Da\{1-(Da/Eth)(\eta e\ EbpFk\ m,n+\eta f \cdot FbpFk\ k,l)\}$ $DsFk\ m,n = DsFk-1-C(DsFk-1-Dsk)$ $EbpFk\ m,n = \Sigma\Sigma DsFk-1\ n+i,\ m+j \cdot Sd\ n+i,\ m+j \cdot Eid\ i,j / \Sigma\Sigma Da \cdot Eid\ i,j$ $FbpFk\ k,l = \Sigma EFk-1\ n+i,\ m+j \cdot Fid\ i,j / \Sigma\Sigma Da \cdot Fid\ i,j$ (Equation 12)

The recalculation is repeated until desirable precision in a dimension is reached. In this method, it is necessary to store an dose obtained at the last time.

Figure 3:
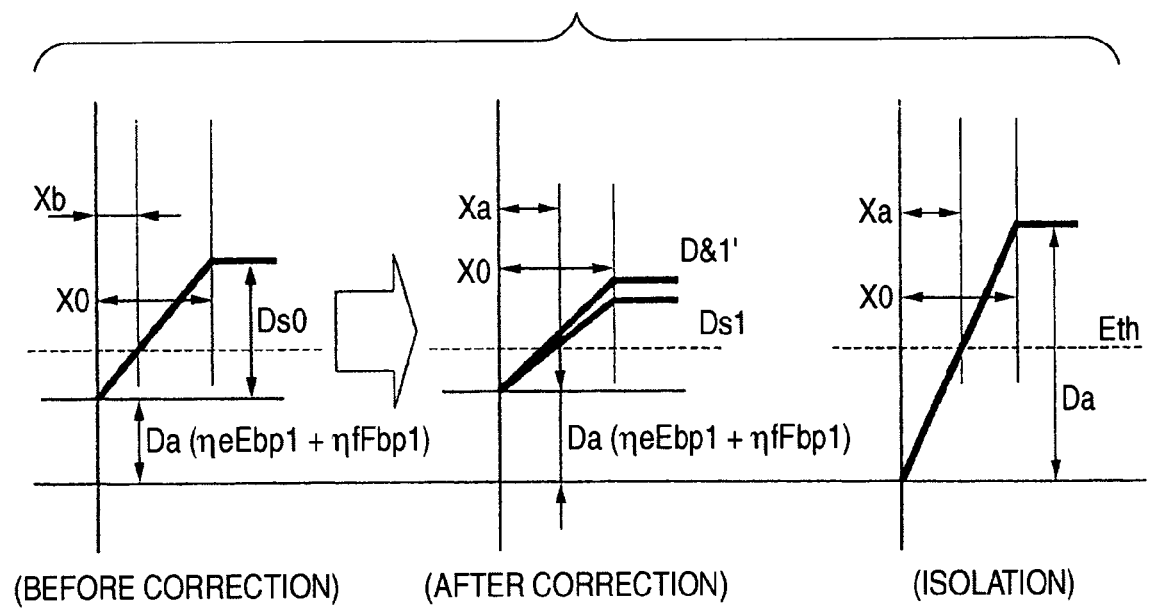
FIG. 3 is a conceptual diagram showing a recalculation according to a second embodiment of the electron beam writing method in accordance with the invention.

FIG. 3 is a conceptual diagram showing a recalculation according to the second embodiment.

As shown in FIG. 3, in the second embodiment, an offset component obtained by adding a backward scattering component and a Foggy component is fixed in the same manner as in the first embodiment. In the first embodiment, the value Ds1 with which the pattern and the dimension which can disregard the backward scattering and the Foggy component can be coincident with each other has been used as the intensity of the forward scattering component in the recalculation. In the second embodiment, however, a difference between Ds and Ds1 is taken, and the difference (the amount of a fluctuation) is multiplied by a constant value which is equal to or greater than 0 and is smaller than 1 and a value thus obtained is added to original Ds. Ds1' thus obtained is used as a result.

More specifically, in the embodiment, the offset component is fixed as the assumption of the calculation. If the amount of exposure is caused to fluctuate, actually, the offset component is also changed. Accordingly, Ds1 is brought into the overcorrecting state, while Ds1' in the embodiment can avoid the overcorrecting state. This is said to be the analogy of a feedback coefficient for enhancing the convergence of a feedback circuit.

Advantage of Second Embodiment

In the embodiment, it is possible to carry out a correction with high precision in consideration of both a Foggy effect and a proximity effect and the convergence of a solution is more excellent than that in the first embodiment. In order to obtain precision to an almost equal extent, it is sufficient that the number of times of a recalculation is approximately ⅓ of that in the first embodiment.

Third Embodiment

A third embodiment provides a method of incorporating the correction of a developing uniformity on the assumption of the use of the first embodiment or the second embodiment. Description will be given on the assumption that a device for carrying out writing by an electron beam of 50 kV is used as a writing device.

First of all, a writing pattern to be a correcting object is divided by a Foggy mesh (1 mm square (in all directions) in the embodiment) and a proximity effect correcting mesh (0.5 μm square (in all directions) in the embodiment).

The in-plane distribution (nonuniformity) of development is caused by a fluctuation in an in-plane sensitivity or a developing threshold. Therefore, there is obtained the distribution of the amount of reference exposure in which an isolated pattern is finished to have a desirable dimension in the plane, and the distribution is assigned to each Foggy mesh. The reason is that a developing uniformity is a phenomenon which can be described by a region in order of mm.

Description will be given to a calculating method in the case in which the amount of reference exposure is assigned to each Foggy mesh.

In this example, it is assumed that the method according to the first embodiment is used.

Firs to fall, a first calculating technique will be described.

For the Foggy mesh and the proximity effect correcting mesh, rates SdF k,l and SdP m,n of areas to be written are obtained. More specifically, SdF k,l represents a writing area density for each of Foggy meshes k and l and SdP m, n represents a writing area density for each of proximity effect correcting meshes m and n.

Referring to a Foggy component and backward scattering, stored energies based on a Foggy effect and a proximity effect in case of the execution of exposure in a state in which a correction for a calculating object mesh is not carried out at all are calculated by the following [Equation 13].

Herein, the proximity effect correcting mesh is present in the Foggy mesh.

$$Fbp0\ k,l=\Sigma\Sigma(Da\ k+i,l+j\cdot SdF\ k+i,l+j\cdot Fid\ i,j)/\Sigma\Sigma Da\cdot k,l\ Fid\ i,j$$

$$Ebp0\ m,n=\Sigma\Sigma(Dak,l\cdot SdP\ m+i,n+j\cdot Eid\ i,j)/\Sigma\Sigma Da\ k,l\cdot Eid\ i,j \quad \text{(Equation 13)}$$

Herein, Fbp0 k, l represents a stored energy density obtained by a Foggy effect for a first calculation, Ebp0 m,n represents a stored energy density obtained by a proximity effect for the first calculation, and Da k, l represents an amount of reference exposure of each of the Foggy meshes k and l. Moreover, Fid i, j represents a distribution of a Foggy electron energy intensity given to a peripheral section (i, j) by an incident electron, and Eid i, j represents a distribution of a proximity effect electron energy intensity given to the peripheral section (i, j) by the incident electron.

When developing thresholds in the Foggy meshes k and l are represented as Eth k,l, Da k,l is expressed in the following [Equation 14].

$$Da\ k,l=Da\cdot Eth\ k,l/Eth \quad \text{(Equation 14)}$$

Herein, Da represents a mean value (a reference dose) of the amount of exposure without a correction, and Eth represents a developing threshold with which a pattern having a desirable dimension is obtained by the reference dose Da.

Calculating ranges (the ranges of i and j) are set in such a manner that the influence ranges of the Foggy effect and the proximity effect are sufficiently included. In case of overall painting, if the calculating range is wider than the effect range, Ebp0 m,n has a value of 1.

By Fbp0 k,l and Ebp0 m,n thus obtained, amounts of exposure Ds m,n based on a first calculation in the proximity effect correcting meshes m and n are calculated by the following [Equation 15]. It is assumed that the proximity effect correcting meshes m and n are included in the Foggy meshes k and l.

$$Ds0\ m,n=Da\ k,l\{1+(Da\ k,l/Eth\ k,l)(\eta e\cdot Ebp0\ m,n+\eta f\cdot Fbp0\ k,l)\} \quad \text{(Equation 15)}$$

Herein, Ds0 m,n represents a corrected dose in each of the proximity effect correcting meshes m and n, Da k,l represents a reference dose in each of the Foggy meshes k and l, and Eth k, l represents a developing threshold in each of the Foggy meshes k and l. Moreover, $\eta e$ represents a backward scattering coefficient (an energy ratio of forward scattering to backward scattering) and $\eta f$ represents an energy ratio of the forward scattering to the Foggy effect.

A recalculation (kth) is carried out in the following [Equation 16].

$$Dsk\ m,n=Da\ k,l\{1-(Da\ k,l/Eth\ k,l)(\eta e\cdot Ebpk\ m,n+\eta f\cdot Fbpk\ k,l)\}$$

$$Ebpk\ m,n=\Sigma\Sigma Dsk-1\ n+i,\ m+j\cdot Sd\ n+i,\ m+j\cdot Eid\ i,j/\Sigma\Sigma Da\ k,l\cdot Eid\ i,j$$

$$Fbpk\ k,l=\Sigma\Sigma Ek-1\ n+i,\ m+j\cdot Fid\ i,j/\Sigma\Sigma Da\cdot Fid\ i,j \quad \text{(Equation 16)}$$

Referring to Fpbk k, l, it is necessary to use a mean exposure density Ek-1 in a calculating mesh which is a result obtained by calculating a total dose in the calculating mesh from an dose obtained in a last calculation and subsequently dividing the total dose by the area of the calculating mesh.

The recalculation is repeated until desirable precision in a dimension is reached.

In the embodiment, it is necessary to use a writing device capable of inputting a writing parameter which is varied for each Foggy mesh. As an example of the input of the parameter, a map of "Da, $\eta e$, $\eta f$, Eth k,l" (combination 1) or "a map of Da k,l, a map of $\eta ep$ k,l, a map of $\eta fp$ k,l" (combination 2) can be proposed.

Advantage of Third Embodiment

In the embodiment, it is possible to carry out a correction with high precision in consideration of both the Foggy effect and the proximity effect, and furthermore, to prevent a fluctuation in a dimensional characteristic based on the density of a pattern which is changed by only the in-plane correction of a sensitivity. Accordingly, it is possible to enhance an in-plane uniformity in a resist stage.

Fourth Embodiment

A fourth embodiment provides a method of incorporating the correction of an etching uniformity according to the third embodiment on the assumption that a writing device capable of inputting an exposure parameter every Foggy mesh is used.

The in-plane distribution (nonuniformity) of etching can be represented as the in-plane distribution of an etching critical dimension loss in a state in which the in-plane distribution of a resist can be disregarded, that is, the third embodiment is carried out.

In order to obtain a uniform etching distribution, accordingly, it is necessary to cause a resist dimension to have an in-plane distribution for offsetting the etching critical dimension loss.

First of all, a writing pattern to be a correcting object is divided by a Foggy mesh (1 mm square (in all directions) in the embodiment).

Then, the correction amount of a resist pattern in each Foggy mesh is calculated from the in-plane distribution of the etching critical dimension loss. For example, if a certain Foggy mesh is finished to be thicker by 5 nm than a mean value, the target value of the dimension of a resist is set to be smaller by 5 nm than a mean value.

By such a method, the map of a resist dimension corrected value $\Delta L$ is determined.

More specifically, a reference dose and a device input value are determined for each Foggy mesh as expressed in the following [Equation 17].

$$Da\ k,l=2\cdot Eth\ k,l\{X0/(X0-\Delta L)\}$$

$$\eta ep\ k,l=\eta e\{X0/(X0-\Delta L)\}$$

$$\eta fp\ k,l=\eta f\{X0/(X0-\Delta L)\} \quad \text{(Equation 17)}$$

Herein, Da k, l represents a reference dose in each of Foggy meshes k and l, Eth k,l represents a developing threshold in each of the Foggy meshes k and l, X0 represents a beam drop including a resist performance, ηep k,l represents a backward scattering parameter (a device input value) in each of the Foggy meshes k and l, ηe represents a rate of backward scattering to forward scattering, ηfp k, l represents a Foggy parameter (a device input value) in each of the Foggy meshes k and l, and ηf represents a rate of Foggy to the forward scattering.

In this example, it is assumed that the method according to the first embodiment is used.

First of all, a first calculating technique will be described.

For the Foggy mesh and the proximity effect correcting mesh, rates SdF k,l and SdP m,n of areas to be written are obtained. SdF k,l represents a writing area density for each of the Foggy meshes k and l and SdP m,n represents a writing area density for each of proximity effect correcting meshes m and n.

Referring to a Foggy component and backward scattering, stored energies based on a Foggy effect and a proximity effect in case of the execution of exposure in a state in which a correction for a calculating object mesh is not carried out at all are calculated as expressed in the following [Equation 18].

Herein, the proximity effect correcting mesh is present in the Foggy mesh.

$$Fbp0\ k,l = \Sigma\Sigma(Da\ k+i,l+j \cdot SdF\ k+i,l+j \cdot Fid\ i,j)/\Sigma\Sigma Da\ k,l \cdot Fid\ i,j$$

$$Ebp0\ m,n = \Sigma\Sigma(Da\ k,l \cdot SdP\ m+i,n+j \cdot Eid\ i,j)/\Sigma\Sigma Da\ k,l \cdot Eid\ i,j \quad \text{(Equation 18)}$$

Herein, Da k,l presents a reference dose in each of the Foggy meshes k and l, Fbp0 k, l represents a stored energy density obtained by a Foggy effect for a first calculation, Ebp0 m,n represents a stored energy density obtained by a proximity effect for the first calculation, Fid i,j represents a distribution of a Foggy electron energy intensity given to a peripheral section (i, j) by an incident electron, and Eid i,j represents a distribution of a proximity effect electron energy intensity given to the peripheral section (i, j) by the incident electron.

Calculating ranges (the ranges of i and j) are set in such a manner that the influence ranges of the Foggy effect and the proximity effect are sufficiently included. In case of overall painting, if the calculating range is wider than the effect range, Ebp0 m,n has a value of 1.

By the stored energy density Fbp0 k,l based on the Foggy effect and the stored energy density Ebp0 m,n based on the proximity effect which are obtained, an dose Ds m,n based on a first calculation in each of the proximity effect correcting meshes m and n is calculated by the following [Equation 19]. It is assumed that the proximity effect correcting meshes m and n are included in the Foggy meshes k and l.

$$Ds0\ m,n = Da\ k,l/[1+\{X0/(X0-\Delta L)\}(\eta e \cdot Ebp0\ m,n + \eta f \cdot Fbp0\ k,l)] \quad \text{(Equation 19)}$$

Herein, Ds0 m,n represents a corrected dose, ηe represents a backward scattering coefficient (an energy ratio of forward scattering to backward scattering) and ηf represents an energy ratio of the forward scattering to the Foggy effect.

A recalculation (kth) is carried out in the following [Equation 20].

$$Dsk\ m,n = Da\ k,l[1-\{X0/(X0-\Delta L)\}(\eta e\ Ebpk\ m,n + \eta f \cdot Fbpk\ k,l)]$$

$$Ebpk\ m,n = \Sigma\Sigma Dsk-1\ n+i,\ m+j \cdot Sd\ n+i,\ m+j \cdot Eid\ i,j/\Sigma\Sigma Da\ k,l \cdot Eid\ i,j$$

$$Fbpk\ k,l = \Sigma\Sigma Ek-1\ n+i,\ m+j \cdot Fid\ i,j/\Sigma\Sigma Da \cdot Fid\ i,j \quad \text{(Equation 20)}$$

Referring to Fpbk k,l, it is necessary to use a mean exposure density Ek–1 in a calculating mesh which is a result obtained by calculating a total dose in the calculating mesh from an dose obtained in a last calculation and subsequently dividing the total dose by the area of the calculating mesh.

The recalculation is repeated until desirable precision in a dimension is reached.

In the embodiment, there is used a writing device capable of inputting a writing parameter which is varied for each Foggy mesh. As an example of the input of the parameter, a map of "Da, ηe, ηf, Eth k,l) (combination 1) or "a map of Da k,l, a map of ηep k,l, a map of ηfp k,l" (combination 2) can be proposed.

Advantage of Fourth Embodiment

In the embodiment, it is possible to carry out a correction with high precision in consideration of both the Foggy effect and the proximity effect, and furthermore, to prevent a fluctuation in a dimensional characteristic based on the density of a pattern which is changed by only the in-plane correction of a sensitivity. Accordingly, it is possible to enhance an in-plane uniformity in a resist stage.

Moreover, the dose is controlled. As compared with a fifth embodiment which will be described below, therefore, it is possible to carry out a correction with high precision without depending on writing or the grid of data.

Fifth Embodiment

A fifth embodiment provides a method of incorporating the correction of an etching uniformity according to the third embodiment on the assumption that a writing device capable of inputting an exposure parameter every Foggy mesh is used.

The in-plane distribution (nonuniformity) of etching can be represented as the in-plane distribution of an etching critical dimension loss in a state in which the in-plane distribution of a resist can be disregarded, that is, the third embodiment is carried out.

In order to obtain a uniform etching distribution, accordingly, it is necessary to cause a resist dimension to have an in-plane distribution for offsetting the etching critical dimension loss.

First of all, a writing pattern to be a correcting object is divided by a Foggy mesh (1 mm square (in all directions) in the embodiment).

Then, the correction amount of a resist pattern in each Foggy mesh is calculated from the in-plane distribution of the etching critical dimension loss. For example, if a certain Foggy mesh is finished to be thicker by 5 nm than a mean value, the target value of the dimension of a resist is set to be smaller by 5 nm than a mean value.

By such a method, the map of a resist dimension corrected value ΔL is determined.

Figure 4:
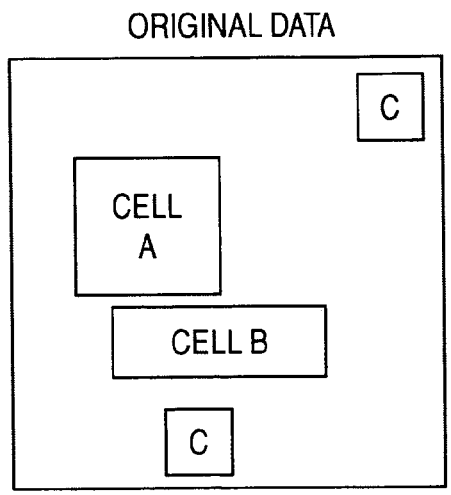
FIGS. 4(a) and 4(b) show conceptual diagrams showing the correspondence relationship between original data and a sizing map in a writing pattern according to a fifth embodiment of the electron beam writing method in accordance with the invention.
Figure 4:
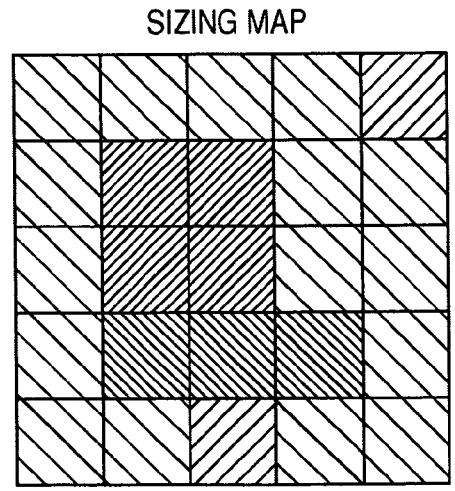
Figure 5:
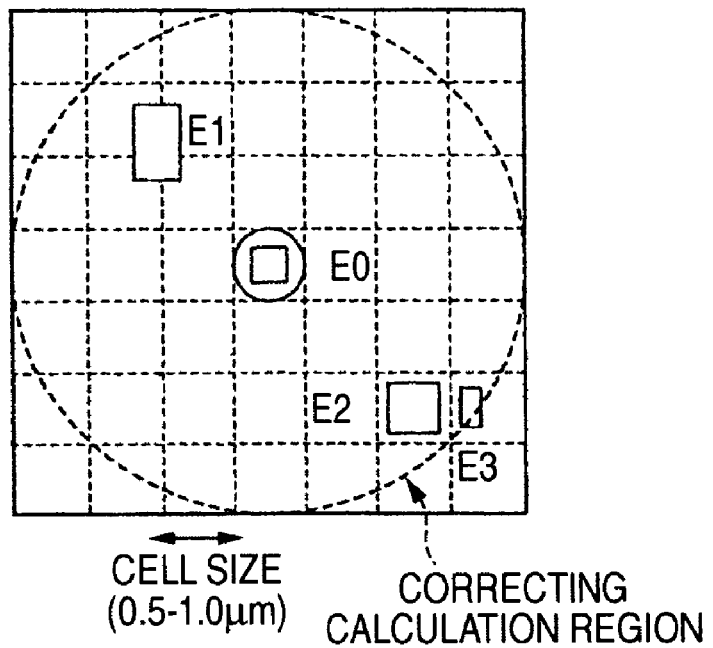
FIG. 5 is a plan view showing a pattern written on a resist.

FIG. 4 is a conceptual diagram showing the correspondence relationship between original data and a sizing map in a writing pattern.

Corresponding to the distribution of original data (design data) shown in (a) of FIG. 4, map data having a layer changed for each Foggy mesh are created corresponding to the value of ΔL as shown in (b) of FIG. 4.

The logical sum (AND) of the original data and a specific layer in the map data is taken and a sizing processing is carried out based on ΔL designated in the specific layer.

This processing is sequentially repeated to create data having different sizing processings.

When the sizing processing is ended, the data are synthesized to create writing data.

By using the writing data thus created, writing is carried out by using the writing device according to the third embodiment.

In the embodiment, it is possible to carry out a correction with high precision in consideration of both the Foggy effect and the proximity effect, and furthermore, to prevent a fluctuation in a dimensional characteristic based on the density of a pattern which is changed by only the in-plane correction of a sensitivity. It is possible to enhance an in-plane uniformity in an etching stage.

In the embodiment, the number of calculations to be carried out by the writing device may be smaller than that in the fourth embodiment. Moreover, the writing device corresponds to the writing device to be used in the third embodiment and is simple.

Sixth Embodiment

Referring to the first calculating equations in the first and second embodiments, the initial value is obtained. Even if precision is not increased greatly, therefore, a convergence is carried out if the number of subsequent calculations is large.

Accordingly, the initial value can also be obtained by the calculation of an dose expressed in the following [Equation 21] which has conventionally been used.

$$[\text{Actual dose}] = [\text{Reference dose}] \times \\ [\text{Amount of dose modulation of proximity effect correction}] \times [\text{Amount of dose modulation of Foggy effect correction}] \quad \text{(Equation 21)}$$

Seventh Embodiment

In this embodiment, the electron beam writing method according to each of the first to sixth embodiments is applied to a method of manufacturing a photomask for manufacturing a semiconductor.

In the embodiment, first of all, a fine pattern having a difference in a density in a plane is written by using the electron beam writing method according to the first embodiment for a resist layer coated to form a shielding film pattern in a photomask blank having a shielding film on a transparent substrate (152.4 mm square (in all directions)).

Subsequently, the resist layer is developed to form a resist pattern and the shielding film is etched by using the resist pattern to be a mask, and the remaining resist pattern is peeled so that the photomask is manufactured.

As a result, it is possible to manufacture a photomask having a shielding film pattern with very high precision in a dimension based on the advantages obtained by the electron beam writing method according to the first embodiment.

In the same manner as in the case in which the electron beam writing method according to each of the second to sixth embodiments is used, moreover, it is possible to manufacture a photo mask having a shielding film pattern with very high precision in a dimension based on the advantages obtained by the electron beam writing method according to each of the embodiments.

While the method of manufacturing a photomask having a shielding film pattern as a mask pattern has been described in the embodiment, an application to the manufacture of another lithography mask may be carried out. For example, it is also possible to use the invention in the manufacture of a mask for X-ray exposure and a mask for electron beam exposure as other masks in addition to a phase shift mask including a phase shift layer as a mask pattern and a photomask for light exposure, and furthermore, to apply the invention irrespective of the type of a mask such as a transmission type or a reflection type.

Eighth Embodiment

Figure 6:
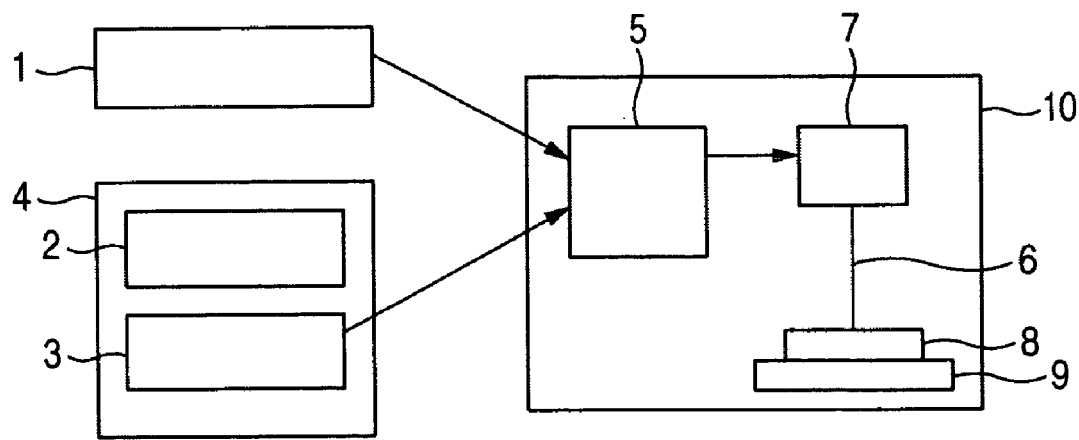
FIG. 6 is a block diagrams of the electron bean writing apparatus used for the first to sixth embodiments.
Figure 7:
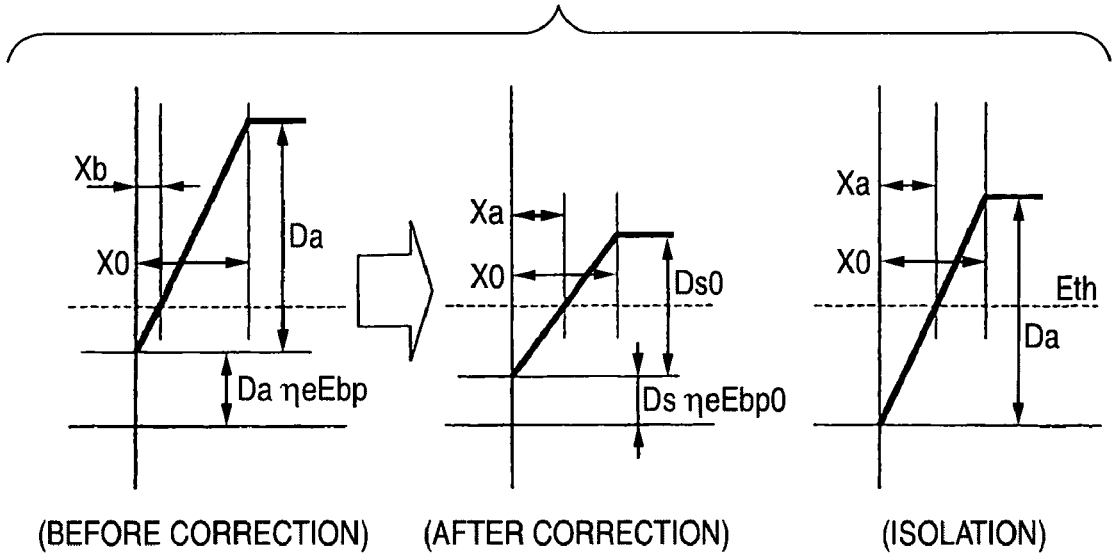
FIG. 7 is a conceptual diagram showing a first calculation in a conventional electron beam writing method.
Figure 8:
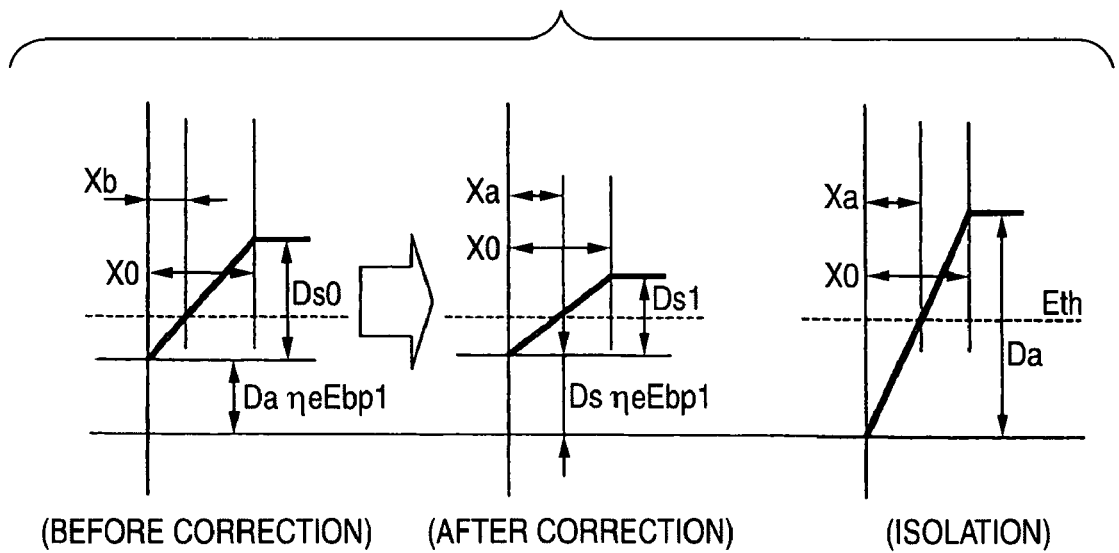
FIG. 8 is a conceptual diagram showing a recalculation in the conventional electron beam writing method.

The embodiment of the electron beam writing apparatus which might be used for the aforementioned embodiments is now described with referring to FIG. 6 below.

The electron beam writing apparatus in this embodiment is comprised of: a pattern information storage section 1 for storing the data of the writing patterns to the exposure target; a computer 2 for calculating the dose which is obtained by any one of the aforementioned first to sixth embodiments; a correction storage section 4 having the storage section 3 in which the data that is calculated by the computer is stored, and the exposure unit 10 which is constituted from: a writing controller 5 for controlling the correction dose in accordance with a pattern information, such as pattern shapes or pattern positions, which is included in the writing regions of the correction target and outputted from a pattern information storage section 1, and a correction information for the predetermined pattern that is calculated, and outputted from the storage 3 of the calculated correction storage section 4; an exposure beam head 7 for emitting the electron beam 6, and a stage 9 for disposing the exposure target 8.

Employing aforementioned methods using the beam writing apparatus as described above can make it possible to form a pattern with high accuracy due to the effect thereof.

It will be apparent to those skilled in the art that various modifications and variations can be made to the described preferred embodiments of the present invention without departing from the spirit or scope of the invention. Thus, it is intended that the present invention cover all modifications and variations of this invention consistent with the scope of the appended claims and their equivalents.

What is claimed is:

1. A method of manufacturing a lithography mask having a mask pattern on a substrate, which mask pattern being formed by writing the mask pattern on a resist film with an electron beam writing method, said writing method comprising the steps of:

dividing a writing pattern to be corrected by meshes for a foggy effect correction and meshes for a proximity effect correction, said meshes for proximity effect correction being finer than the meshes for foggy effect correction;

obtaining an area occupation rate of the writing pattern for each of the meshes for the foggy effect correction and the meshes for the proximity effect correction;

carrying out a first calculation which comprises calculating a stored energy, for each of the meshes for the foggy effect correction and the meshes for the proximity effect correction, on a condition of an exposure with a foggy effect and a proximity effect without correction and, based on the stored energy, obtaining an exposure dose for the meshes for a proximity effect correction, which exposure dose makes a dimension of the mask pattern coincide with a pattern for which an influence of the foggy effect and the proximity effect can be disregarded;

carrying out a recalculation which comprises calculating the stored energy, based on the exposure dose obtained by the first calculation, on the condition of foggy effect and proximity effect, and, based on the stored energy, re-obtaining the exposure dose for the meshes for the proximity effect correction, which exposure dose makes a dimension of the mask pattern coincide with the pattern for which the influence of the foggy effect and the proximity effect can be disregarded; and repeating the recalculation, until a precision in the dimension falls within a predetermined range, to obtain a corrected exposure dose which corrects a dimensional error of the writing pattern caused by the proximity effect and the foggy effect.

2. The method according to claim 1, wherein said recalculation further comprising:

obtaining a difference between the exposure dose calculated by a calculation and the exposure dose calculated by a following calculation, obtaining a value that the difference is multiplied by a figure greater than 0 and smaller than 1, and adding the value thus obtained to the exposure dose of the calculation to make the exposure dose applied for the following calculation for the repeating of the recalculation.

3. The method according to claim 1, wherein;

in the first calculation, the stored energy, as obtained on a condition of an exposure with foggy effect and a proximity effect without correction is subjected to a reduction by an energy amount caused by the foggy effect and the proximity effect, and in the recalculation, the stored energy based on the exposure dose obtained by the previous calculation on the condition of the foggy effect and the proximity effect is applied as fixed.

4. The method according to claim 1, wherein, in the first calculation and the recalculation, a developing threshold for each of the meshes for the foggy effect correction and the meshes for the proximity effect correction is designated so that an in-plane uniformity of development is corrected.

5. The method according to claim 1, wherein, in the first calculation and the recalculation, a developing threshold for each of the meshes for foggy effect correction is designated so that an in-plane uniformity of development is corrected.

6. The method according to claim 1, wherein in the first calculation and the recalculation, a developing threshold and an etching critical dimension loss are designated for each of the meshes for the foggy effect correction and the meshes for the proximity effect correction so that an in-plane uniformity of development and an in-plane uniformity of etching are corrected.

7. The method according to claim 1, wherein in the first calculation and the recalculation, a developing threshold and an etching critical dimension loss are designated for each of the meshes for foggy effect correction so that an in-plane uniformity of development and an in-plane uniformity of etching are corrected.

8. The according to claim 1, wherein in the first calculation and the recalculation, a developing threshold is designated for each of the meshes for the foggy effect correction and the meshes for the proximity effect correction and data subjected to sizing for compensating an etching critical dimension loss are applied as the writing pattern so that an in-plane uniformity of etching is corrected.

9. The method according to claim 1, wherein the exposure dose calculated by the first calculation is obtained by a reference exposure dose, which forms a predetermined dimension of the writing pattern on a condition with no foggy effect and no proximity effect, multiplied by a modulation amount for the proximity effect correction and by a modulation amount for the foggy effect correction.

* * * * *